United States Patent
Kotsubo et al.

(10) Patent No.: US 6,506,090 B2
(45) Date of Patent: Jan. 14, 2003

(54) DISPLAY PANEL AND METHOD OF MANUFACTURING ELECTROMAGNETIC-WAVE SHIELDING AND LIGHT TRANSMITTING PLATE

(75) Inventors: Hidefumi Kotsubo; Yasuhiro Morimura, both of Tokyo; Itsuo Tanuma, Saitama, all of (JP)

(73) Assignee: Bridgestone Corporation, Tokyo (JP)

( * ) Notice: Subject to any disclaimer, the term of this patent is extended or adjusted under 35 U.S.C. 154(b) by 16 days.

(21) Appl. No.: 09/995,572

(22) Filed: Nov. 29, 2001

(65) Prior Publication Data
US 2002/0039004 A1 Apr. 4, 2002

Related U.S. Application Data

(63) Continuation of application No. PCT/JP01/03501, filed on Apr. 24, 2001.

(30) Foreign Application Priority Data

May 18, 2000 (JP) ........................................ 2000-146894
May 18, 2000 (JP) ........................................ 2000-146895

(51) Int. Cl.[7] .............................. H01J 9/20; H01J 29/06
(52) U.S. Cl. ........................................................ 445/49
(58) Field of Search ........................................ 445/49, 52

(56) References Cited

U.S. PATENT DOCUMENTS 4,446,372 A * 5/1984 Gurnee ........................ 250/334
5,489,489 A * 2/1996 Swirbel et al. ............... 428/209
5,920,142 A * 7/1999 Onishi et al. ............. 310/313 R

FOREIGN PATENT DOCUMENTS

| JP | 11-177271 | 7/1999 |
|----|-----------|--------|
| JP | 11-233992 | 8/1999 |
| JP | 2000-13089 | 1/2000 |
| JP | 2000-66614 | 3/2000 |
| JP | 2000-114773 | 4/2000 |

* cited by examiner

Primary Examiner—Kenneth J. Ramsey

(57) ABSTRACT

A display panel such as a plasma display panel is provided in which an electromagnetic-wave shielding material is integrated whereby electromagnetic-wave shielding efficiency is imparted to a display panel itself. A transparent film 2 having a conductive pattern 3 is bonded to a front surface of a plasma display panel 20 by transparent adhesives 4A. The conductive pattern 3 is in a mesh form having a line width of 50 $\mu$m or less and an open area ratio of 75% or more and is formed by vapor plating or liquid phase plating. To form a conductive pattern, dots 12 are printed on a transparent film 11 by using material which is soluble in solvent such as water. Then, a conductive material layer 13 is formed so as to cover over all the dots 12 and exposed portions of the transparent film 11. The film 11 is cleaned by the solvent such as water. By the cleaning process, the soluble dots 12 are dissolved and the conductive material on the dots 13 are also removed from the film 11. Accordingly, conductive material formed on the exposed portions are left uncovered by the dots so as to form a conductive pattern 14. In this manner, the conductive pattern 14 plated on areas of the film 11 other than the dots 12 is formed.

8 Claims, 3 Drawing Sheets i)

ii)

iii)

iv)

DISPLAY PANEL AND METHOD OF MANUFACTURING ELECTROMAGNETIC-WAVE SHIELDING AND LIGHT TRANSMITTING PLATE

CROSS REFERENCE TO RELATED APPLICATION

This is a continuation application of PCT/JP01/03501 filed on Apr. 24, 2001.

FIELD OF THE INVENTION

The present invention relates to a display panel such as plasma display panel (hereinafter, referred to as "PDP"). The present invention further relates to a method of manufacturing an electromagnetic-wave shielding and light transmitting plate to be used as a front filter for a PDP, and windows of building which need electromagnetic wave shielding, such as a hospital.

RELATED BACKGROUND ART

PDPs (plasma display panels) utilizing discharge phenomenon have been researched and developed as display panels for television sets, office automation apparatuses such as personal computers and word processors, traffic control signs, signboards, and other display boards.

A PDP includes two glass plates, a large number of discharge cells formed by partitions between the two glass plates, and fluorescent substances within the respective discharge cells. The fluorescent substances are selectively excited to emit light by discharge, thereby displaying characters and/or figures. As shown in FIG. 3, such a PDP comprises a front glass 21, a rear glass 22, partitions 23, display cells (discharge cells) 24, auxiliary cells 25, cathodes 26, display anodes 27, and auxiliary anodes 28. Disposed in each display cell 24 is a red, green, or blue fluorescent substance (not shown) which is a film-like form attached to the inside thereof. These fluorescent substances emit light by electrical discharges when a voltage is applied between electrodes.

From the front surface of the PDP, electromagnetic waves with frequency from several kHz to several GHz are generated due to applying voltage, electrical discharge, and light emission. The electromagnetic waves are required to be shielded. In addition, for improving its display contrast, reflection of external light at the front surface is required to be prevented.

In order to shield such electromagnetic waves from PDP, a transparent plate which has electromagnetic-wave shielding property is disposed in front of the PDP.

As an electromagnetic-wave shielding material for an electromagnetic-wave shielding and light transmitting plate, a conductive mesh member is employed which is a 5- to 500-mesh member having a line width from 10 to 500 μm and an open area ratio (open area percentage) less than 75%.

The electromagnetic-wave shielding plate having such a conductive mesh member with low open area ratio as mentioned above has light transmitting property of 70% at the most. Moreover, conventional conductive mesh members easily allow the production of moire patterns due to relations between its patterns and pixel pitch.

JP H11-204045A discloses a display panel comprising a plasma display panel and a transparent substrate bonded to a front of the plasma display panel by transparent adhesives. The display panel has a conductive layer on a bonding surface of the transparent substrate which is made of conductive ink or paste by pattern printing and formed in a lattice with a line width of 200 μm or less and an open area ratio of 75% or more.

In the display panel, the PDP and the transparent substrate formed with the conductive layer are integrated together by transparent adhesives as mentioned, thereby lightening its weight, making it's thickness thinner, reducing the number of parts, and thus improving the productivity and reducing the cost.

The pattern printing enables the formation of a conductive layer into a lattice having high open area ratio while having narrow line width, that is, a line width of 200 μm or less and an open area ratio of 75% or more. Such a conductive layer having high open area ratio and narrow line width has excellent light transmission properties and can prevent the moire phenomenon.

It should be noted that the term "open area ratio" is calculated from the line width of the mesh and the number of lines existing in one-inch width.

Employed as the conductive ink mentioned above is binder resin (ink medium) in which conductive particles are dispersed. The conductive ink needs to have high viscosity to keep the dispersed state of conductive particles in the conductive ink. Therefore, it is impossible to make the line width of the printed pattern of the conductive ink significantly narrow and also impossible to make the open area ratio significantly high.

SUMMARY OF THE INVENTION

It is an object of the present invention to provide a display panel in which an electromagnetic-wave shielding material formed with a conductive pattern is disposed on and integrated with the front surface of the display panel, wherein the conductive pattern is in a mesh-like form having an enough small line width and significantly high open area ratio.

It is another object of the present invention to provide a method of manufacturing an electromagnetic-wave shielding and light transmitting plate formed with a mesh-shaped conductive pattern having an enough small line width and significantly high open area ratio.

A display panel of the present invention comprises: a display panel body, a transparent film disposed on a front surface of the display panel body, and a conductive pattern formed on the transparent film. The conductive pattern is a mesh-like pattern composed of a vapor plated layer or a liquid phase plated layer.

The display panel can achieve improvement of the productivity and reduction in the cost because the display panel comprises the display panel body and the transparent film formed with a conductive pattern, thereby lightening its weight, making its thickness thinner, reducing the number of parts.

The conductive pattern is manufactured according to the method of manufacturing an electromagnetic-wave shielding and light transmitting plate of the present invention, comprising a step of forming dots of material which is soluble in solvent on a film surface, a step of forming a conductive material layer which is insoluble in the solvent on the film surface by a vapor plating or a liquid phase plating, and a step of removing the dots and portions of the conductive material layer on the dots by bringing the film surface in contact with the solvent.

According to this manufacturing method, the material which is soluble in the solvent has no conductive particles dispersed therein. Therefore, the dots can be printed or formed by using the material having low viscosity. Therefore, fine and precision printing can be achieved in such a manner as to form significantly narrow spaces defined by the dots. Since the narrow spaces between the dots are areas on which conductive material is left to form a mesh-like conductive pattern, the conductive pattern having significantly fine line width can be formed with high accuracy. By reducing the line width, the open area ratio of the mesh can be greater.

According to the present invention, it is preferable that the conductive pattern is a conductive mesh pattern having a line width of 50 μm or less and an open area ratio of 75% or more. The conductive pattern having narrower line width and greater open area ratio can exhibit excellent light transmission properties and prevent the moire phenomenon.

DETAILED DESCRIPTION OF THE PREFERRED EMBODIMENTS

Figure 1:
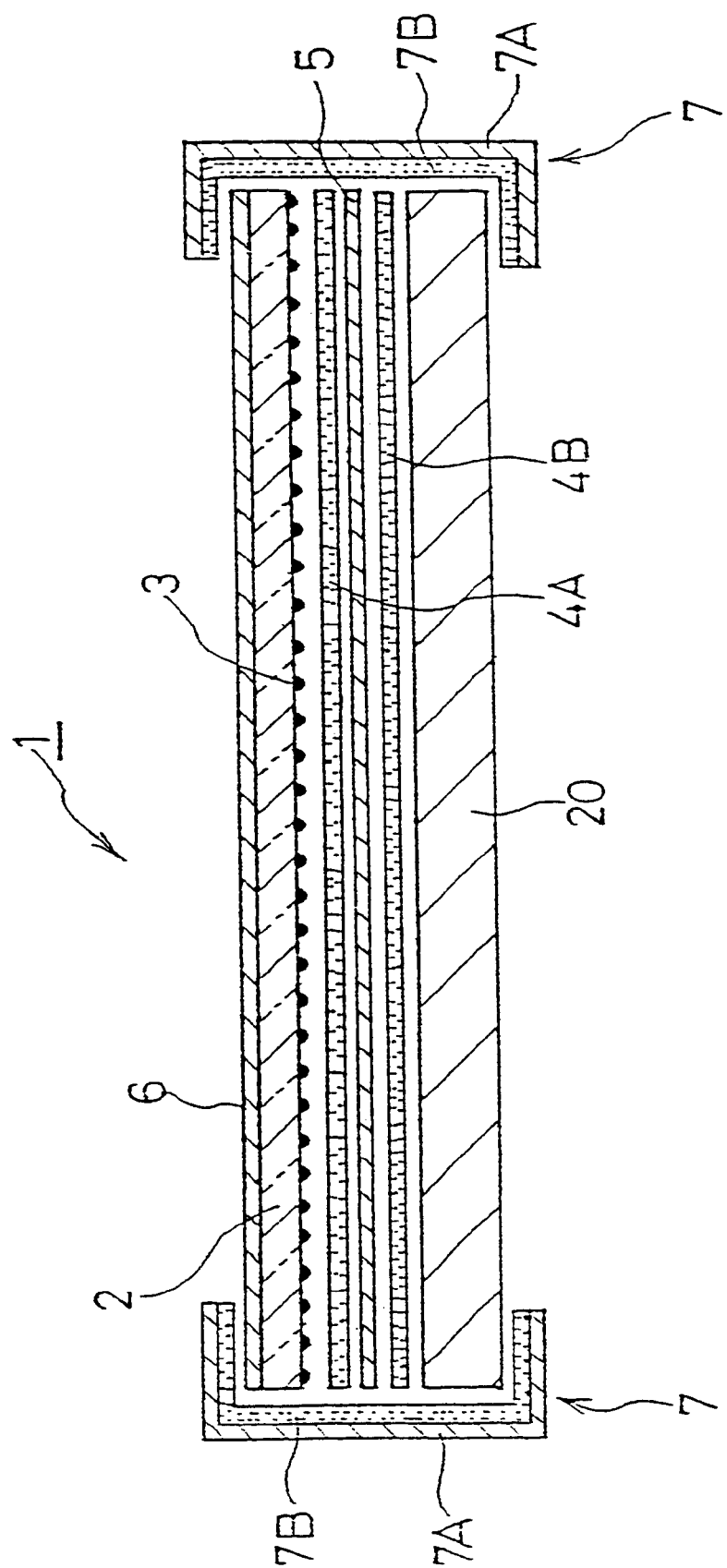
FIG. 1 is a schematic sectional view showing an embodiment of a display panel according to the present invention.

FIG. 1 is a schematic sectional view showing an embodiment of a display panel of the present invention. Though the panel shown in FIG. 1 is a preferred embodiment of the present invention, the present invention is not limited to this embodiment.

Figure 3:
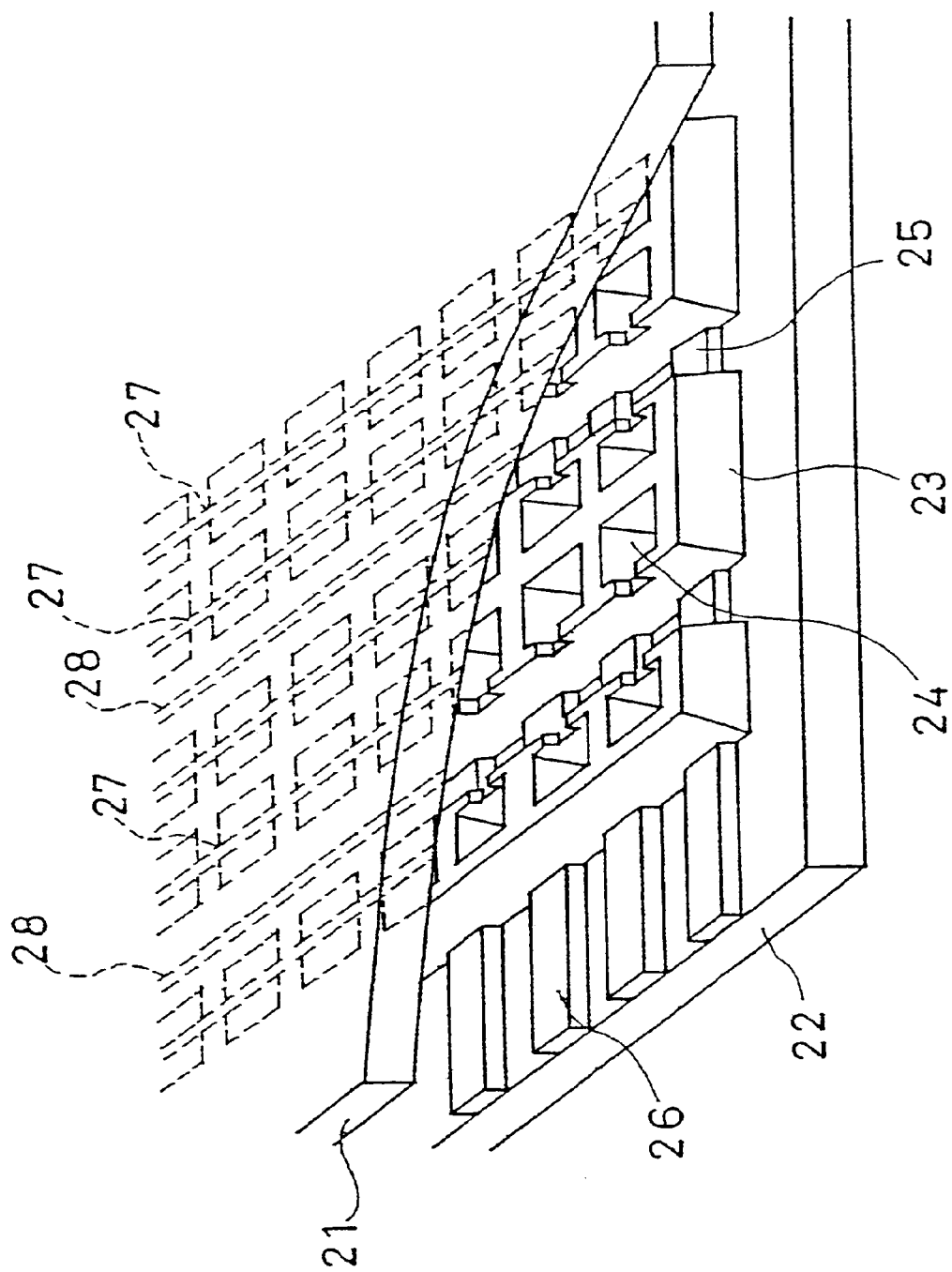
FIG. 3 is a partially cutaway perspective view showing an example of the structure of a PDP.

The display panel 1 comprises a transparent film 2 having an antireflection film 6 disposed on its front surface and a conductive pattern 3 disposed on its rear surface, a transparent conductive film 5, and a PDP 20 wherein they are bonded together so as to have an assembled body. The PDP 20 may be the one shown in FIG. 3 and may be any of PDPs regardless of structure. The rear surface of the transparent film 2 and the transparent conductive film 5 are bonded to each other via an intermediate adhesive layer 4A and the transparent conductive film 5 and the PDP 20 are bonded to each other via an intermediate adhesive layer 4B.

Figure 2:
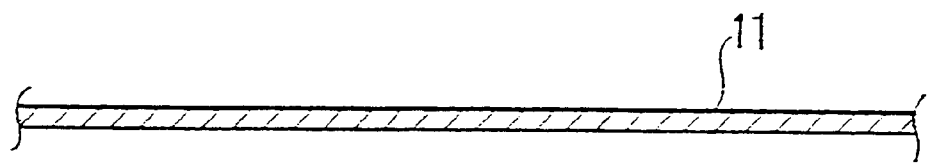
FIG. 2 is an views explaining a method of manufacturing an electromagnetic-wave shielding and light transmitting plate.
Figure 2:
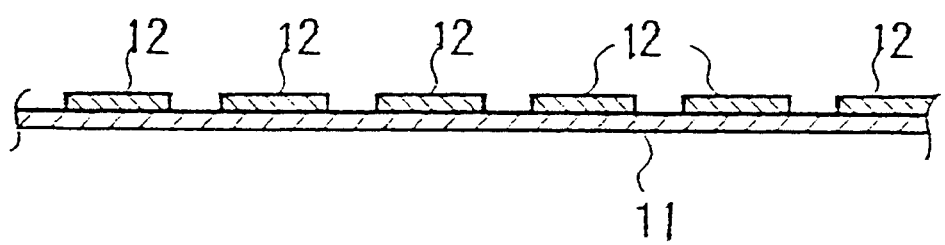
Figure 2:
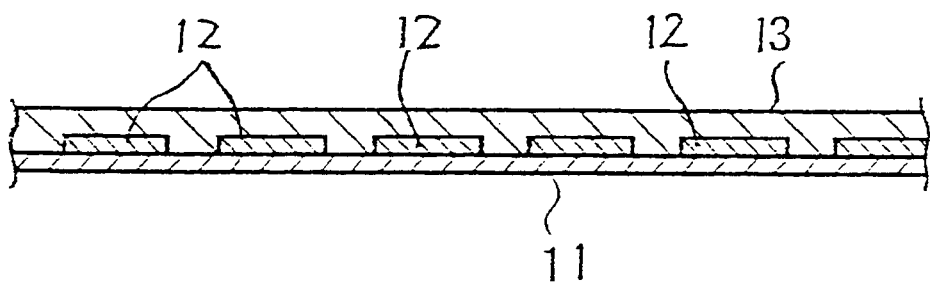
Figure 2:
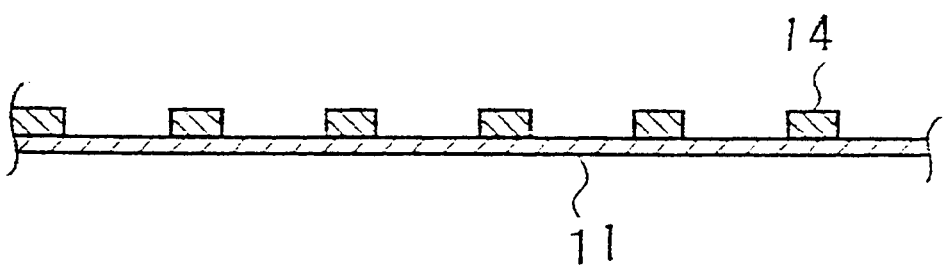

Description will now be made as regard to the structure of a film with a conductive pattern and a method of manufacturing the same with reference to FIG. 2. FIG. 2 is a sectional view showing an example of the method of manufacturing a film with a conductive pattern according to the method of manufacturing an electromagnetic-wave shielding and light transmitting plate of the present invention. First, as shown in i), ii), dots 12 are printed on a transparent film 11 by using material which is soluble in solvent such as water. Then, as shown in iii), a conductive material layer 13 is formed so as to cover over all the dots 12 and exposed portions, not covered by the dots 12, of the transparent film 11. The film 11 is cleaned by the solvent such as water. During this cleaning process, if necessary, a dissolving promotion means such as ultrasonic irradiation and rubbing with a brush or sponge may be additionally employed.

By the cleaning process, as shown in iv), the soluble dots 12 are dissolved and the conductive material on the dots 12 are also removed from the film 11. Accordingly, conductive material formed on the exposed portions are left on the film 11 without being covered by the dots so as to form a conductive pattern 14. The conductive pattern 14 is disposed between the dots 12 and is thus formed in a mesh shape as a whole.

By making the space between the respective pair of dots 12 narrower, the conductive mesh pattern 14 having a narrow line width is formed. By making the area of the respective dot 12 larger, the conductive mesh pattern 14 having a large open area ratio is formed. Printing material or ink employed as the material for forming the dots 12 which is soluble in the solvent such as water as mentioned above does not require particles to be dispersed therein. Therefore, ink having low viscosity can be employed. By employing such ink having low viscosity, the dots can be printed in such a manner as to form a fine dot pattern.

After the step shown in iv), the film 11 is rinsed, if necessary, and dried. In this way, the electromagnetic-wave shielding and light transmitting plate is manufactured.

Now, suitable examples of the above respective materials will be described.

Examples of material of the transparent film 11 include polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic acid copolymer, polyurethane, and cellophane. Among these examples, PET, PC, and PMMA are preferable.

The thickness of the transparent film is normally in a range from 1 μm to 5 mm. However, the thickness may be suitably determined in accordance with the application of the plate regardless of this range.

The dots formed on the film 11 are preferably formed by printing. As the printing ink, the solution of the material which is solvable in the solvent for removing the dots is employed. As the solvent for removing the dots, organic solvent may be employed. Preferable solvent is water. The water may not contain any agent and may be solution of something, such as acid solution, alkaline solution, or solution of surface active agent. For facilitating the checking of printing condition, the ink may further include coloring agent such as dye and pigment.

When the solvent is water, the material of forming the dots is preferably water-soluble and high molecular material such as polyvinyl alcohol.

The dots 12 are printed in such a manner that a mesh pattern is formed by exposed area around the dots of the film. It is preferable that the dots 12 are printed such that the line width of the exposed area is 50 μm or less. The printing method may be gravure printing, screen printing, ink jet printing, or electrostatic printing. Among these printing methods, the gravure printing is, suitable for achieving fine line width.

The configuration of the dots may be arbitrarily selected and thus may be circle, ellipse, or rectangle. Among these configurations, rectangle, particularly square, is preferable.

The thickness of the dot formed by printing is not particularly limited, but normally in a range from 0.1 to 5 μm.

After printing the dots on the film, the film is preferably dried and then conductive material layer 13 is formed. Suitably employed as the conductive material is metal such as aluminium, nickel, indium, chromium, gold, vanadium, tin, cadmium, silver, platinum, copper, titanium, cobalt, or lead, alloy thereof, or conductive oxide such as ITO.

It is not preferable that the conductive material layer 13 is too thin because it leads to poor electromagnetic-wave shielding property. It is also not preferable that the conductive material layer 13 is too thick because it affects the thickness of the resultant electromagnetic-wave shielding and light transmitting plate and narrows the angle of visibility. Therefore, the thickness of the conductive material 13 is preferably in a range from 0.5 to 100 µm.

Examples as the method of forming the conductive material layer 13 include vapor plating such as sputtering, ion plating, vacuum evaporation, and chemical vapor deposition, liquid phase plating such as electro plating and electroless plating, printing, and applying. Among these methods, the vapor plating in the broad sense including sputtering, ion plating, vacuum evaporation, and chemical vapor deposition, and the liquid phase plating are suitable.

After the conductive material layer 13 is formed, as mentioned above, the dots 12 are removed by solvent or, preferably, water and, if necessary, the film is dried, thereby manufacturing the electromagnetic-wave shielding and light transmitting plate.

Hereinafter, an example of the method of manufacturing the electromagnetic-wave shielding and light transmitting plate will be described.

A 20% aqueous solution of polyvinyl alcohol is deposited to print dots on a polyethylene film of 500 µm in thickness. Each dot is formed in a square: 234 µm×234 µm. Distance between each pair of dots is 20 µm. The dots are arranged in a square lattice. The thickness of printed dots is about 5 µm after dried.

Aluminium is deposited on the dots and exposed portions of the film to have an average thickness of 10 µm by vacuum evaporation. Then, they are immersed in cold water and rubbed by a sponge so as to dissolve and remove the dots. After that, they are rinsed by water and then dried, thereby manufacturing the electromagnetic-wave shielding and light transmitting plate.

The conductive layer formed on the surface of the film is arranged in a square lattice exactly corresponding to the negative pattern of the dots, wherein the line width is 20 µm and the open area ratio is 77%. The average thickness of the conductive layer (aluminium layer) is 10 µm.

As shown in FIG. 1, an antireflection film 6 is formed on the front surface of the transparent film 2. As the antireflection film 6, an example of a single film is the following (a), and examples of a laminated film of high-refractive transparent film(s) and low-refractive transparent film(s) are the following (b)–(e):

(a) a film consisting of a lower-refractive transparent film than the transparent substrate;
(b) a laminated film consisting of a high-refractive transparent film and a low-refractive transparent film, i.e. two films in amount;
(c) a laminated film consisting of two high-refractive transparent films and two low-refractive transparent films which are alternately laminated, i.e. four films in amount;
(d) a laminated film consisting of a medium-refractive transparent film, a high-refractive transparent film, and a low-refractive transparent film in this order, i.e. three films in amount; and
(e) a laminated film consisting of three high-refractive transparent films and three low-refractive transparent films which are alternately laminated, i.e. six films in amount.

As the high-refractive transparent film, a thin film, preferably a transparent conductive thin film, having a refractive index of 1.8 or more can be made of ITO (tin indium oxide), ZnO, ZnO in which Al is doped, $TiO_2$, $SnO_2$ or ZrO. On the other hand, as the low-refractive transparent film, a film can be made of low-refractive material having a refractive index of 1.6 or less such as $SiO_2$, $MgF_2$, or $Al_2O_3$. The thickness of the films is changed according to the film structure, the film kind, and the central wavelength because the refractive index in a visible-light area is reduced by interference of light. In case of four-layer structure, the antireflection film is formed in such a manner that, in order from the transparent substrate, the first layer (high-refractive transparent film) is from 5 to 50 nm, the second layer (low-refractive transparent film) is from 5 to 50 nm, the third layer (high-refractive transparent film) is from 50 to 100 nm, and the fourth layer (low-refractive transparent film) is from 50 to 150 nm in thickness.

An antifouling film may be further formed on the antireflection film 6 to improve the fouling resistance of the surface. The antifouling film is preferably a fluorine or silicone thin film having a thickness in a range from 1 to 1000 nm.

The front surface of the transparent film 2 may be further processed by hard coating with silicone material and/or anti-glare finish by hard coating including light-scattering agent.

Since the open area ratio of the conductive pattern 3 is increased to improve the light transmission properties in this embodiment, another transparent conductive film 5 is interposed between the transparent film 2 and the PDP 20 to compensate for lack of electromagnetic-wave shielding property by the conductive pattern 3.

Employed as the transparent conductive film 5 may be a resin film in which conductive particles are dispersed or a base film formed with a transparent conductive layer.

The conductive particles to be dispersed in the film may be any particles having conductivity and the following are examples of such conductive particles:

(i) carbon particles or powder;
(ii) particles or powder of metal such as nickel, indium, chromium, gold, vanadium, tin, cadmium, silver, platinum, aluminum, copper, titanium, cobalt, or lead, alloy thereof, or conductive oxide thereof; and
(iii) particles made of plastic such as polystyrene and polyethylene, which are surfaced with coating layer of a conductive material from the above (i) and (ii).

Because the conductive particles of large particle diameter affect the light transmission properties and the thickness of the transparent conductive film 5, it is preferable that the particle diameter is 0.5 mm or less. The preferable particle diameter of the conductive particles is between 0.01 and 0.5 mm.

The high mixing ratio of the conductive particles in the transparent conductive film 5 spoils the light transmission properties, while the low mixing ratio makes poor electromagnetic-wave shielding capability. The mixing ratio of the conductive particles is therefore preferably between 0.1 and 50% by weight, particularly between 0.1 and 20% by weight and more particularly between 0.5 and 20% by weight, relative to the resin of the transparent conductive film 5.

The color and the luster of the conductive particles can be suitably selected according to the application. In case of a filter for a display panel, conductive particles having a dark color such as black or brown and dull surfaces are preferable. In this case, the conductive particles can suitably adjust the light transmittance of the filter so as to make the display easy-to-see.

The transparent conductive layer on the base film can be made of tin indium oxide, zinc aluminum oxide, or the like by one of methods including vapor deposition, sputtering, ion plating, and CVD. In this case, when the thickness of the transparent conductive layer is 0.01 µm or less, sufficient electromagnetic-wave shielding efficiency can not be obtained, because the thickness of the conductive layer for the electromagnetic-wave shielding is too thin, while when exceeding 5 µm, light transmission properties may be spoiled.

Examples of matrix resins of the transparent conductive film 5 or resins of the base film include polyester, polyethylene terephthalate (PET), polybutylene terephthalate, polymethyl methacrylate (PMMA), acrylic board, polycarbonate (PC), polystyrene, triacetate film, polyvinyl alcohol, polyvinyl chloride, polyvinylidene chloride, polyethylene, ethylene-vinyl acetate copolymer, polyvinylbutyral, metal ionic cross-linked ethylene-methacrylic acid copolymer, polyurethane, and cellophane. Preferably selected from the above are PET, PC, and PMMA.

The thickness of the transparent conductive film 5 is usually in a range of 1 µm-5 mm.

As shown in FIG. 1, the transparent conductive film 5 and the conductive pattern 3 are both employed, thereby obtaining excellent electromagnetic-wave shielding property.

According to the present invention, a heat-ray blocking film may be interposed between the transparent film 2 and the PDP 20. As the heat-ray blocking film, a film comprising a base film on which a heat-ray blocking coating of zinc oxide or silver thin film is applied can be employed. In this case, the base film is preferably made of PET, PC, or PMMA. The thickness of the film is preferably set in a range from 10 m to 20 mm to prevent the thickness of the resultant display panel from being too thick and to ensure its easy handling and its durability. The thickness of the heat-ray blocking coating, which is formed on this base film, is usually in a range from 500 Å to 5000 Å.

Examples of adhesive resins for bonding the transparent film 2 formed with the conductive pattern 3, the transparent conductive film 5, and PDP 20 include copolymers of ethylene group, such as ethylene-vinyl acetate copolymer, ethylene-methyl acrylate copolymer, ethylene-(meth) acrylic acid copolymer, ethylene-ethyl (meth) acrylic acid copolymer, ethylene-methyl (meth) acrylic acid copolymer, metal ionic cross-linked ethylene-(meth) acrylic acid copolymer, partial saponified ethylene-vinyl acetate copolymer, calboxylated ethylene-vinyl acetate copolymer, ethylene-(meth) acrylic-maleic anhydride copolymer, and ethylene-vinyl acetate-(meth) acrylate copolymer. It should be noted that "(meth) acrylic" means "acrylic or methacrylic". Besides the above resins, polyvinyl butyral (PVB) resin, epoxy resin, acrylic resin, phenol resin, silicone resin, polyester resin, or urethane resin may also be employed.

The PDP and the transparent film may be bonded together by transparent and elastic adhesives, in preparation for damage of the PDP. As the resin of the transparent elastic adhesive, resins usually used as adhesives for laminated glasses may be employed and ethylene-vinyl acetate copolymer (EVA) is preferably employed. In terms of the impact resistance, the perforation resistance, the adhesive property, and the transparency, PVB resin often used for laminated glasses for automobile is also preferable.

As EVA, EVA including vinyl acetate in an amount of 5–50% by weight, preferably 15–40% by weight, is employed. Less than 5% by weight of vinyl acetate interferes with the weatherability and the transparency, while exceeding 40% by weight of vinyl acetate significantly reduces mechanical characteristics, makes the film forming difficult, and produces a possibility of blocking between films.

As the crosslinking agent, in case of crosslinked by heating, organic peroxide is preferable. The organic peroxide is selected according to the temperature for sheet process, the temperature for crosslinking, and the storage stability. Examples of available peroxide include 2,5-dimethylhexane-2,5-dihydro peroxide; 2,5-dimethyl-2, 5-di (t-butyl-peroxy)-hexane-3; di-t-butyl peroxide; t-butylcumyl peroxide; 2,5-dimethyl-2,5-di(t-butyl-peroxy)-hexane; dicumyl peroxide; α, α'-bis(t-butyl peroxy isopropyl)-benzene; n-butyl-4,4-bis (t-butyl-peroxy)-valerate;2,2-bis(t-butyl-peroxy)-butane; 1,1-bis (t-butyl-peroxy)-cyclohexane; 1,1-bis(t-butyl-peroxy)-3,3,5-trimethylcyclohexane; t-butyl peroxy benzoate; benzoyl peroxide; tert-butyl peroxy acetate; 2,5-dimethyl-2,5-bis (tert-butyl-peroxy)-hexyne-3; 1,1-bis(tert-butyl-peroxy)-3, 3,5-trimethylcyclohexane; 1,1-bis (tert-butyl-peroxy)-cyclohexane; methyl ethyl ketone peroxide; 2,5-dimethylhexyl-2, 5-bis-peroxy-benzoatetert-butyl-hydroperoxide; p-menthane hydroperoxide; p-chlorobenzoyl peroxide; tert-butyl peroxyisobutyrate; hydroxyheptyl peroxide; and chlorohexanone peroxide. These are used alone or in mixed state, normally 5 parts by weight or less, preferably from 0.5 to 5.0 parts by weight per 100 parts by weight of EVA.

The organic peroxide is normally mixed to the EVA by an extruder or a roll mill or may be added to the EVA film by means of impregnation by dissolving the peroxide into organic solvent, plasticizer, or vinyl monomer.

In order to improve the properties of the EVA, such as mechanical strength, optical property, adhesive property, weatherability, blushing resistance, and crosslinking rate, a compound containing acryloxy group or methacryloxy group and allyl group may be added into the EVA. Such a compound used for this purpose is usually acrylic acid or methacrylic acid derivative, for example, ester or amide thereof. Examples of ester residues include alkyl group such as methyl, ethyl, dodecyl, stearyl, and lauryl and, besides such alkyl group, cyclohexyl group, tetrahydrofurfuryl group, aminoethyl group, 2-hydroxyethyl group, 3-hydroxypropyl group, and 3-chloro-2-hydroxypropyl group. Ester with polyfunctional alcohol such as ethylene glycol, triethylene glycol, polyethylene glycol, trimetylolpropane, or pentaerythritol may be also employed. The typical amide is diacetone acrylamide.

More concretely, examples include compounds containing polyfunctional ester such as acrylic ester or methacrylate such as trimetylolpropane, pentaerythritol and glycerin, or allyl group such as triallyl cyanurate, triallyl isocyanurate, diallyl phthalate, diallyl isophthalate, and diallyl maleate. These are used alone or in the mixed state, normally from 0.1 to 2 parts by weight, preferably from 0.5 to 5 parts by weight per 100 parts by weight of EVA.

When the EVA is crosslinked by light, photosensitizer is used instead of the above peroxide, in an amount of normally 5 parts by weight or less, preferably from 0.1 to 3.0 parts by weight per 100 parts by weight of EVA.

In this case, examples of available photosensitizer include benzoin; benzophenone; benzoin methyl ether; benzoin ethyl ether; benzoin isopropyl ether; benzoin isobutyl ether; dibenzyl; 5-nitroacenaphthene; hexachlorocyclopentadiene; p-nitrodiphenyl; pnitroaniline; 2,4,6-trinitroaniline; 1,2-benzanthraquinone; and 3-methyl-1, 3-diaza-1,9-benzanthrone. These can be used either alone or in the mixed state.

In this case, silane coupling agent may be further used as adhesive accelerator. Examples of the silane coupling agent include vinyltriethoxysilane, vinyl-tris α-methoxyethoxy) silane, γ-methacryloxypropyl trimethoxy silane, vinyltriacetoxy silane, γ-glycidoxypropyltrimetoxysilane, β-glycidoxypropyltrietoxysilane, β(3,4-epoxycyclohexyl) ethyl trimethoxy silane, γ-chloropropyl methoxy silane, vinyltrichlorosilane, γ-mercaptopropyl trimethoxy silane, γ-aminopropyl triethoxy silane, and N-β-(aminoethyl)-γ-aminopropyl trimethoxy silane.

These are used alone or in the mixed state, normally from 0.001 to 10 parts by weight, preferably from 0.001 to 5 parts by weight per 100 parts by weight of EVA.

It is preferable that the PVB resin contains polyvinyl acetal between 70 and 95% by unit weight and polyvinyl acetate between 1 and 15% by unit weight, and has an average degree of polymerization between 200 and 3000, preferably 300 and 2500. The PVB resin is used as resin composition containing plasticizer.

Examples of plasticizer in the PVB resin composition include organic plasticizers, such as monobasic acid ester and polybasic acid ester, and phosphoric acid plasticizers.

Preferable examples of such monobasic acid ester are ester as a result of reaction of organic acid, such as butyric acid, isobutyric acid, caproic acid, 2-ethylbutyric acid, heptoic acid, n-octylic acid, 2-ethylhexylic acid, pelargonic acid (n-nonylic acid), or decylic acid, and triethylene glycol and, more preferably, are triethylene-di-2-ethylbthyrate, triethylene glycol-di-2-ethylhexoate, triethylene glycoldi-caproate, and triethylene glycol-di-n-ocotoate. Ester of one of the above organic acids and tetraethylene glycol or tripropylene glycol may be also employed.

Preferable examples of plasticizers of polybasic acid ester group are ester of organic acid, such as adipic acid, sebacic acid, or azelaic acid, and straight chain like or brunch like alcohol with from 4 to 8 carbon atoms and, more preferably, are dibutyl sebacate, dioctyl azelate, and dibutyl carbitol adipate.

Examples of phosphoric acid plasticizers include tributoxyethyl phosphate, isodecyl phenyl phosphate, and triisopropyl phosphate.

Insufficient plasticizer in the PVB resin composition reduces the film-forming property, while excessive plasticizer spoils the durability during high temperature. Therefore, the amount of plasticizer in the PVB resin composition is between 5 and 50 parts by weight, preferably between 10 and 40 parts by weight, per 100 parts by weight of polyvinyl butyral resin.

The resin composition of the intermediate adhesive layers may further include, in small amounts, stabilizer, antioxidant, ultraviolet absorbing agent, infrared absorbing agent, age resistor, paint processing aid, and/or coloring agent for preventing degradation. If necessary, it may still further include, in small amounts, filler such as carbon black, hydrophobic silica and calcium carbonate.

It is also effective that the intermediate adhesive layers in sheet condition are surfaced by corona discharge process, low temperature plasma process, electron beam irradiation process, or ultraviolet irradiation process as measures of improving the adhesive property.

The intermediate adhesive layers can be manufactured, for example, by first mixing the EVA or PVB and the additives listed above, kneading them by an extruder or a roll, and after that, forming in a predetermined configuration by means of a film forming method such as calendaring, rolling, T-die extrusion, or inflation. During the film formation, embossing is provided for preventing the blocking between sheets and facilitating the deaerating during compressed onto the transparent substrate or the front board of the PDP.

For example, in the display panel 1 shown in FIG. 1, intermediate adhesive layers 4A, 4B are used which are formed by molding as mentioned. The transparent conductive film 5 is sandwiched between the intermediate adhesive layers 4A, 4B to form an adhesive film. This adhesive film is interposed between the transparent film 2 on which the conductive pattern 3 is previously formed and the PDP 20. After pre-compression bonding by deaerating them in vacuumed and warmed conditions, they are heated or radiated with light to harden the adhesive layers so as to form an integrated unit. In this manner, the display panel 1 is made.

The intermediate adhesive layers 4A, 4B are molded to have thickness from 1 μm to 1 mm so as to prevent the thickness of the adhesive layer from being too thick.

After the transparent film 2, the transparent conductive film 5, and the PDP 20 are integrated, a conductive adhesive tape 7 is wound around the periphery of the integrated unit to fix the margins and then is fixed by the hardening method of the conductive adhesive tape 7 such as contact bonding in heated condition.

In this embodiment, the conductive adhesive tape 7 adheres to all around the peripheral ends of the integrated unit of the transparent film 2, the transparent conductive film 5, and the PDP 20 and also adheres to outer edges of both surfaces of the integrated unit, i.e. outer edges of the front surface of the transparent film 2 and outer edges of the rear surface of the PDP 20. However, it is not limited thereto.

The conductive adhesive tape 7 is formed, for example, by laying a conductive adhesive layer 7B on one surface of a metal foil 7A. The metal foil 7A for the conductive adhesive tape 7 may be made of metal such as copper, silver, nickel, aluminum, or stainless steel, having a thickness of 1 μm to 100 μm.

The conductive adhesive layer 7B is formed by applying adhesive material, in which conductive particles are dispersed, onto one surface of the metal foil 7A.

Examples of the adhesive material include epoxy or phenolic resin containing hardener, acrylic adhesive compound, rubber adhesive compound, silicone adhesive compound and the like.

Conductive materials of any type having good electrical conductivity may be employed as the conductive particles to be dispersed in the adhesive. Examples include metal powder of, for example, copper, silver, and nickel, metal oxide powder of, for example, tin oxide, tin indium oxide, and zinc oxide, and resin or ceramic powder coated with such a metal or metal oxide as mentioned above. There is no specific limitation on its configuration so that the particles may have any configuration such as scale-like, dendritic, granular, pellet-like, spherical, stellar, or confeito-like (spherical with many projections) configuration.

The content of the conductive particles is preferably 0.1–15% by volume relative to the adhesive and the average particle size is preferably 0.1–100 m.

The thickness of the adhesive layer 7B is in a range from 5 to 100 μm in a normal case.

In order to ensure the electrical conductivity between the conductive adhesive tape 7, the conductive pattern 3, and the transparent conductive film 5, a conductive tape is preferably provided around the periphery of the transparent film 2, on which the conductive pattern 3 is formed, and the periphery of the transparent conductive film 5 to outwardly extend from the peripheries and the extending portion of the conductive tape is bonded to the sides of the integrated unit with the conductive adhesive tape 7 so as to provide a conductive parts.

In this manner, the display panel 1 with the conductive adhesive tape 7 can be simply and easily built in a body of equipment just by inlaying in the body of equipment. In addition, good electrical conductivity between the conductive pattern 3 and the body of equipment can be provided uniformly along the circumferential direction through the conductive adhesive tape 7. Therefore, good electromagnetic-wave shielding efficiency can be obtained.

INDUSTRIAL APPLICABILITY

As described in detail, according to the present invention, by integrating a display panel such as a PDP and a transparent film on which a conductive pattern is formed, electromagnetic-wave shielding property is imparted to the display panel itself, thereby lightening its weight, making its thickness thinner, reducing the number of parts, and thus improving the productivity and reducing the cost. In addition, it can prevent the malfunction of a remote controller.

By utilizing a transparent film on which a conductive pattern in a lattice form with narrower line width and greater open area ratio is formed, desired electromagnetic-wave shielding property and excellent light transmission properties are obtained and the moire phenomenon is prevented, thus providing distinct pictures.

According to the present invention, an electromagnetic-wave shielding and light transmitting plate can be easily manufactured which has a conductive pattern in mesh form with narrower line width and greater open area ratio.

What is claimed is:

1. A method of manufacturing an electromagnetic-wave shielding and light transmitting plate, comprising:

a step of forming dots of material which is soluble in a solvent on a film;

a step of forming a conductive material layer of material which is insoluble in the solvent on the film; and a step of removing the dots and the conductive material layer on the dots by bringing the film in contact with the solvent.

2. A method of manufacturing an electromagnetic-wave shielding and light transmitting plate as claimed in claim 1, wherein the solvent is water.

3. A method of manufacturing an electromagnetic-wave shielding and light transmitting plate as claimed in claim 2, wherein the material which is soluble in the solvent is water soluble high molecular material.

4. A method of manufacturing an electromagnetic-wave shielding and light transmitting plate as claimed in claim 3, wherein the water soluble high molecular material is polyvinyl alcohol.

5. A method of manufacturing an electromagnetic-wave shielding and light transmitting plate as claimed in claim 1, wherein the dots are formed by printing.

6. A method of manufacturing an electromagnetic-wave shielding and light transmitting plate as claimed in claim 1, wherein the conductive material layer is formed by vapor plating or liquid phase plating.

7. A method of manufacturing an electromagnetic-wave shielding and light transmitting plate as claimed in claim 1, wherein the conductive material layer is formed by applying.

8. A method of manufacturing an electromagnetic-wave shielding and light transmitting plate as claimed in claim 1, wherein a conductive material pattern in lattice form having an open area ratio of 75% or more is formed by the removal of the dots and the portions of the conductive material layer on the dots.

* * * * *